United States Patent [19]

Gaensslen et al.

[11] 4,268,952

[45] May 26, 1981

[54] METHOD FOR FABRICATING SELF-ALIGNED HIGH RESOLUTION NON PLANAR DEVICES EMPLOYING LOW RESOLUTION REGISTRATION

[75] Inventors: Fritz H. Gaensslen, Yorktown Heights; Eberhard A. Spiller, Mt. Kisco, both of N.Y.

[73] Assignee: International Business Machines Corporation, Armonk, N.Y.

[21] Appl. No.: 28,461

[22] Filed: Apr. 9, 1979

[51] Int. Cl.³ .......................................... H01L 21/302
[52] U.S. Cl. ..................................... 29/571; 29/578; 29/580; 148/1.5; 148/187
[58] Field of Search ........................ 29/571, 578, 580; 357/42, 56; 148/1.5, 187

[56] References Cited

U.S. PATENT DOCUMENTS

| | | | |
|---|---|---|---|
| 3,518,509 | 6/1970 | Cullis | 357/42 |
| 3,598,664 | 8/1971 | Kilby | 29/580 |
| 3,968,562 | 7/1976 | Van Lierof | 29/571 |
| 4,027,380 | 6/1977 | Deal | 29/571 |

Primary Examiner—G. Ozaki
Attorney, Agent, or Firm—John J. Goodwin

[57] ABSTRACT

A method is disclosed for fabricating structures having electrically conductive regions such as high resolution semiconductor device and circuit designs which require only low resolution alignment steps during fabrication. The method is used to fabricate metal semiconductor field effect transistors (MESFET) and metal oxide semiconductor field effect transistors (MOSFET) devices and incorporates the following features. A device with very small (i.e. submicron) dimensions is positioned in a relatively large device well such that the exact position of the device in its well is not critical. Isolation and interconnection of devices in different wells is achieved by standard masking and alignment techniques with a resolution corresponding to the larger dimensions of the device wells. All high resolution features of the device are contained in a single masking level, however, to separate and insulate different elements of the device at such small dimensions different height levels are used in the device so that one masking step can produce zero lateral spacing between the different device elements. The disclosure provides examples of the present method applied to the fabrication of a MESFET device and a MOSFET device and to the isolation and interconnection of single devices into large circuits on a semiconductor chip.

5 Claims, 11 Drawing Figures

METHOD FOR FABRICATING SELF-ALIGNED HIGH RESOLUTION NON PLANAR DEVICES EMPLOYING LOW RESOLUTION REGISTRATION

DESCRIPTION

Technical Field

The present invention relates to a method for fabricating structures having electrically conductive regions such as semiconductor devices of very small dimensions without the necessity for high precision alignment, and more particularly to a fabrication method wherein isolation and insulation of small device elements is achieved in part by forming the elements at different height levels.

Background Art

In the prior art, fabrication techniques have been proposed to provide self-aligned devices with reduced dimensions which are formed using a reduced number of masking steps. In the publication "A New Fabrication Method of Short Channel MOSFET—Multiple Walls Self-Aligned MOSFET" by Hiroshi Shibata, Hideo Iwaski, Taiji Oku and Yasuo Tarui published in the digest of the IEEE International Electron Devices Meeting, Washington, 1977, p. 395, a fabrication procedure for a MOSFET is described wherein a resist is coated on a silicon surface and multiple walls are formed by lithography. When irradiated with a parallel ion beam at an oblique angle against the wafer surface, the spaces between the walls become partly shaded and no processing occurs in the shaded areas. Because of this shadowing technique, the source, drain, gate and their electrodes are self-aligned and delineated by a single masking and exposure step.

The subject invention method is different from the technique described by Shibata et al. in that isolation is not achieved by shadowing resulting from an oblique ion beam.

In another prior art publication, "Improvement of the Drain Breakdown Voltage of GaAs Power MESFET's by a Simple Recess Structure" by T. Furutsuka, T. Tsuji and F. Hasegawa, IEEE Transactions of Electron Devices, June 1978, Vol. ED-25 No. 6, pp. 563–567, a technique is described wherein a type of non self-aligned heights level difference is used to improve the drain breakdown voltage. The drain breakdown voltage is improved by a recess structure achieved by increasing the thickness of the active epitaxial layer at the drain contact region of the MESFET. The use of such recess for the gate electrode is distinct in structure, function and fabrication from the method of the present invention wherein a MESFET or MOSFET is fabricated using only one high resolution mask and wherein device isolation is achieved by means of different height levels produced by etching the pattern defined by the masking step.

DISCLOSURE OF THE INVENTION

Figure 1A:
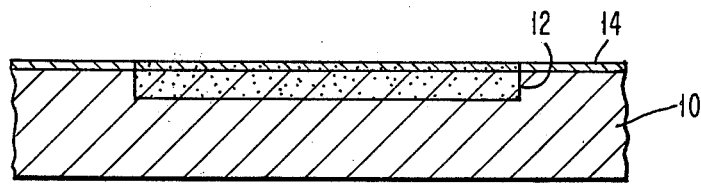
FIGS. 1A through 1E are schematic illustrations of a series of method steps for fabricating a selfealigned MESFET device according to the principles of the present invention.

The fabrication of FET (Field Effect Transistor) devices has been improved by advances in lithographic techniques wherein patterns with linewidths of submicron dimension can be achieved with high resolution. Also, lithographic techniques providing a large depth of focus allow the formation of high resolution patterns on non planar surfaces. However, most semiconductor devices require several lithographic steps which have to be aligned to each other. Alignment capabilities for these lithographic techniques have not been advanced to the same extent as the resolution capabilities, and particularly in the fabrication of submicron dimension devices over a large area misalignment is a serious problem because the dimensional stability of the wafers and the lithographic masks may not be sufficient to allow registration over large areas. The method of the present invention overcomes these problems in that it includes steps for forming device and circuit designs which require only crude alignment during fabrication.

The method of the present invention employs several basic features to achieve the described results. A device with very small elements is positioned in a relatively large device well and is defined in such a way that the exact position of the device in its well is not critical. The isolation and interconnection of devices in different device wells is achieved by standard masking and alignment techniques with resolution requirements which correspond to the dimensions of the large device wells and all high resolution elements of the device are contained in a single masking level and wherein different elements of the device are separated by different height levels. For example, two metal films which must be insulated from each other can be fabricated in one evaporation step if two different elevation levels are used. This permits zero lateral spacing between different device elements.

The first example of the present method is the fabrication of a self-aligned n-channel MESFET (metal-semiconductor field effect transistor). A MESFET is essentially a junction field-effect transistor with the pn junction replaced by a Schottky-barrier contact as a control gate. Normally a MESFET is a depletion mode device, however, it can also be designed to be of enhancement type. This requires proper thickness and doping level in the channel and forward biasing of the gating metal semiconductor junction for turning on the device. The device requires relatively few processing steps, does not need a gate oxide and consequently does not suffer from trapping of hot electrons in the oxide. However, the accurate alignment between gate and source/drain electrodes is critical with respect to device performance. The following method provides a solution to the alignment considerations in the fabrication of a n-channel MESFET. The method is also applicable to the fabrication of the dual device, a self-aligned p-channel MESFET.

FIGS. 1A through 1E illustrate selected steps in the fabrication of an n-channel MESFET. In the process, only three masking steps are required and only the second masking step has to be of high resolution. In FIG.

1A a high resistivity self-isolating substrate 10 is provided, composed for example of silicon, gallium arsenide or any other suitable semiconductor material. A device well 12 is formed by ion implantation and/or diffusion of a donor type impurity (phosphorus or arsenic) through a first mask. A blanket layer 14 of higher donor doping concentration (phosphorus or arsenic) is then provided at the surface by ion implantation without using a mask. This layer yields ohmic contacts with a metal layer.

Next the device areas are defined in a second masking step by applying a layer of resist and defining the source, drain and gate patterns through a high resolution mask. Light, x-ray or electron-beam lithography exposure techniques may be employed, and this is the only instance in the process where a higher resolution mask is required.

Figure 1B:
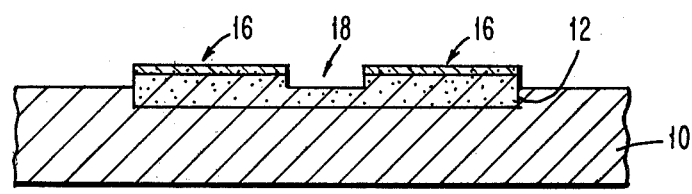

The structure is then dry etched down to the level illustrated in FIG. 1B to form the source, drain regions 16 and the gate region 18. A metallization step is then performed using aluminum or another fine grain metal to contact the source, drain areas and to form the gate electrode 20. The prior art requires several separate masking steps to do the same task.

It should be noted that the source and drain regions resemble pedestals so that other device elements may be isolated from the source and drain regions without the need of any lateral spacing. This permits the device gates to be of very small dimension resulting in high performance, which is an important consideration in large scale integrated circuits.

Figure 1C:
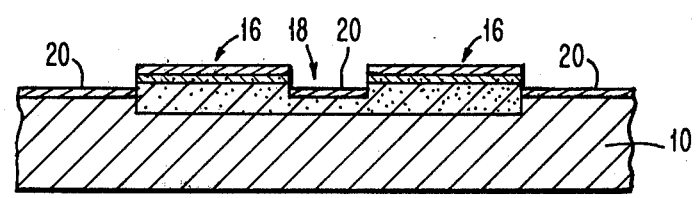

Another feature of the present invention observed in FIG. 1C is that the gate region 18 is self-aligned with the source and drain region 16 using one masking step.

Figure 1D:
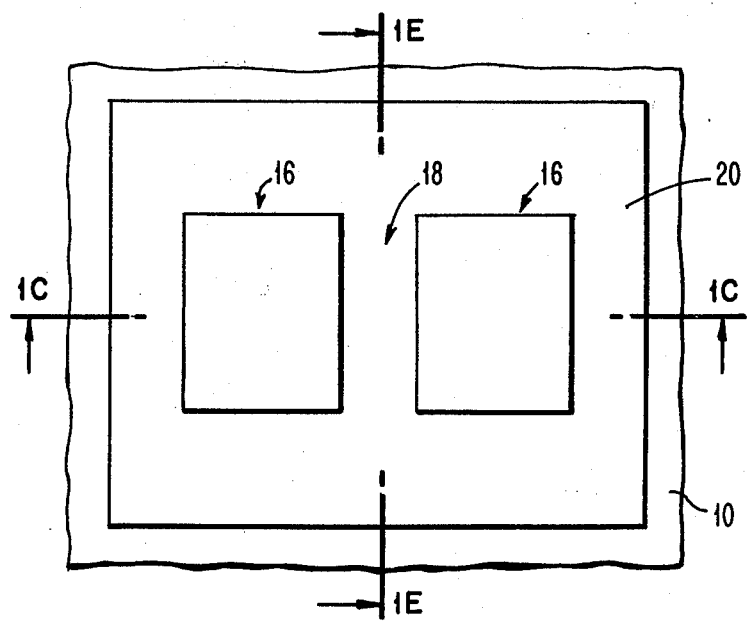

FIG. 1D depicts the top view of the structure of FIG. 1C and illustrates that the relatively short active device gate 18 is positioned within the relatively large device well such that the exact position of the device in the well during fabrication is not critical. There is a large area available for the gate, source and drain contacts and therefore they can be formed in a third masking step using lithography with coarse tolerances.

Figure 1E:
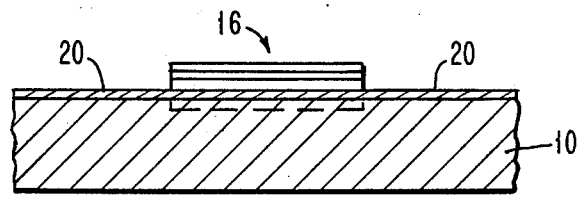

Finally, FIG. 1E illustrates a side view of the structure taken through the cross-section of FIG. 1D just as FIG. 1C shows the cross-section of FIG. 1D in an orthogonal direction.

Figure 2A:
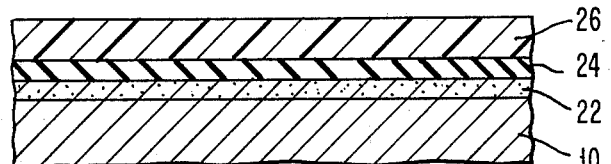
FIGS. 2A through 2E are schematic illustrations of a series of method steps for fabricating a MOSFET device according to the principles of the present invention.
Figure 2B:
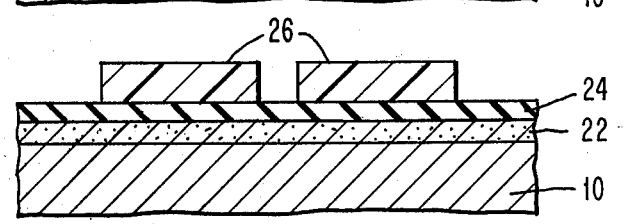
Figure 2C:
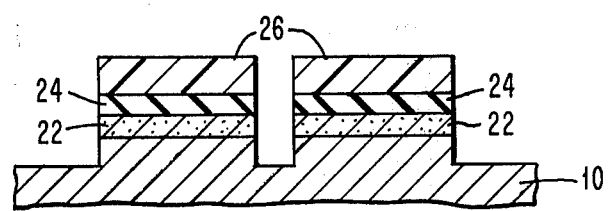

FIGS. 2A through 2E illustrate selected steps in the fabrication of a sample n-channel MOSFET device according to the present invention. In FIG. 2A the p-silicon or other suitable substrate material 10 is provided and a blanket doping layer 22 is formed by ion implantation and/or diffusion of a donor type impurity (phosphorus or arsenic). A layer of silicon nitride 24 is then formed over layer 22 by, for example, chemical vapor deposition. The silicon nitride is used to prevent oxidation of the source and drain regions when they are formed in subsequent steps. A layer of resist 26 is then applied for use in a lithographic step. To define the device elements (source, drain, gate) the resist layer 26 is exposed via x-ray, electron-beam or photolithography and developed as shown in FIG. 2B. Next, the structure is dry etched down into the substrate 10 as depicted in FIG. 2C.

Figure 2D:
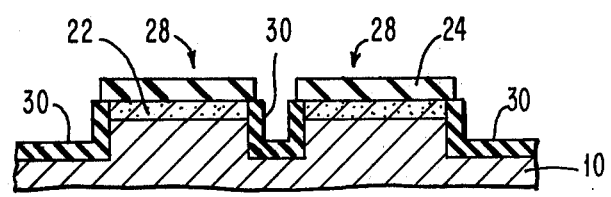
Figure 2E:
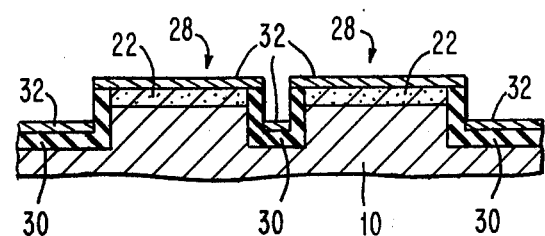

The resist layer 26 is then removed and a gate oxide is grown on the exposed areas 30 of the silicon substrate 10 and layer 22. The surfaces covered by the silicon nitride layer 24 define the source/drain regions 28 as shown in FIG. 2D. Next, the silicon nitride layer 24 is removed and a metallization step is performed using aluminum or another suitable fine grain metal 32 to provide the gate electrode and the source/drain contacts shown in FIG. 2E. The top view of the structure of FIG. 2E is essentially the same as FIG. 1D and the MOSFET device incorporates the same advantages as the aforesaid MESFET such as the self-aligned device elements being isolated by use of different height levels to reduce lateral spacing and the need for only one high resolution masking step.

In the previous discussion it was stated that substrate 10 may be composed of silicon, which is assumed to be of p-type conductivity, and therefore the ion implanted layer 22 has to be n+ doped (phosphorus or arsenic) to provide source and drain for an n-channel device. If a p-channel structure is desired an n-type silicon substrate is used and the ion implanted layer has to be p+ type (aluminum or gallium).

The metal films 20 or 32 may also be replaced by other highly conducting films as for example by a heavily doped polysilicon film. To assure discontinuity between metal layers placed on different height levels, steep sidewalls are desirable. In the case of a metal conductor, discontinuity can be improved by a short dip etch to remove any potential conducting bridges between levels. In the case where doped polysilicon is used as a conductor, the same result can be achieved by a short oxidation step to remove any conductive polysilicon between levels.

Figure 3:
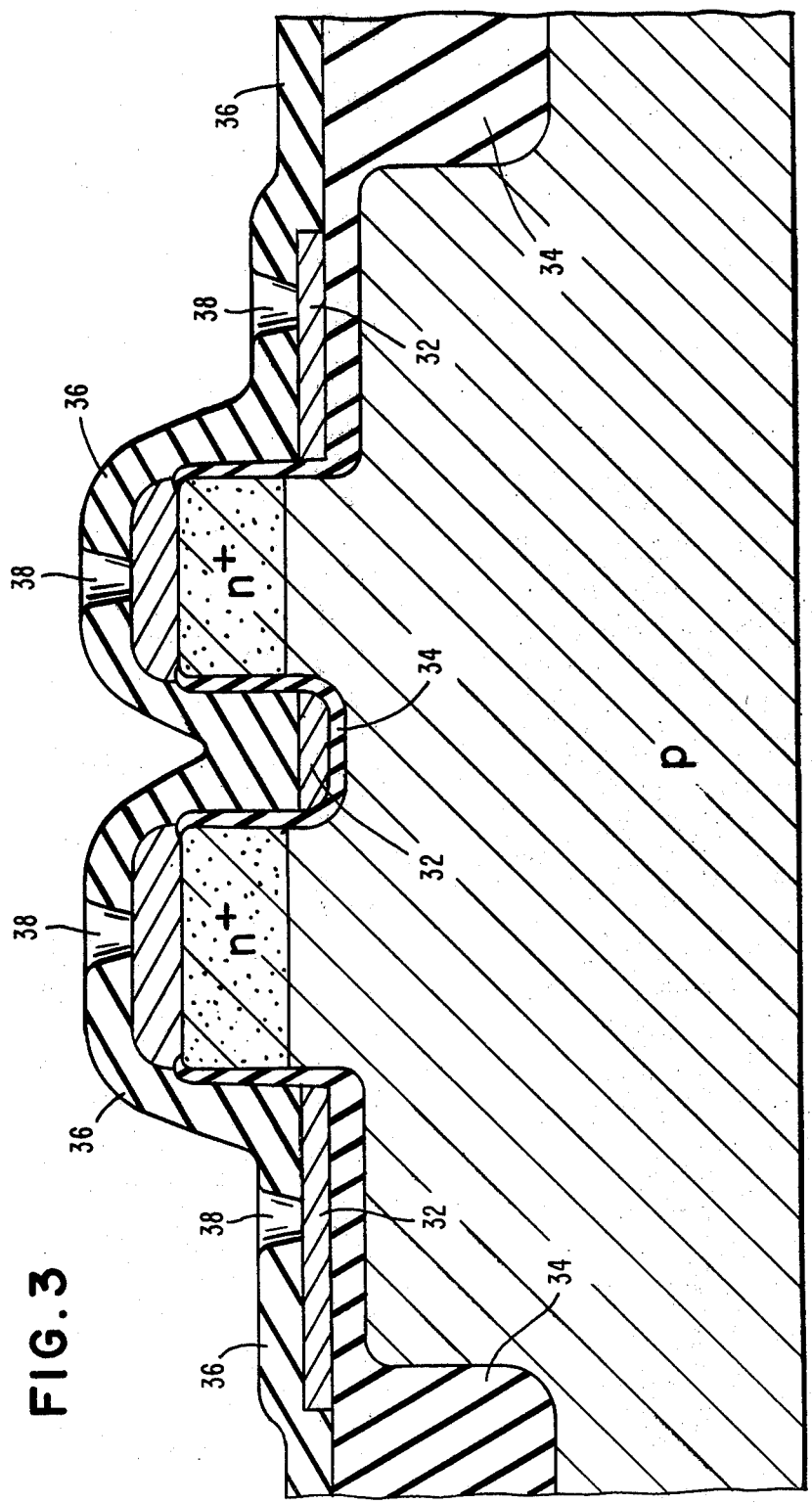
FIG. 3 is a schematic cross-section illustration of the MOSFET device which provides an example of how single devices can be integrated into a large circuit on a chip.

Referring to FIG. 3, a cross sectional illustration of the MOSFET device is shown which provides an example of how single devices within one chip can be isolated and integrated into large circuits. Each MOSFET on a chip is surrounded by a recessed oxide layer 34 which isolates different devices from each other. The recessed oxide is most conveniently grown before the fabrication steps described in FIG. 2. Patterning of this recessed oxide requires a coarse mask similar to that used for the fabrication of the device well for the MESFET. The difference between the MESFET and the MOSFET fabrication is that for the MESFET the device well is ion implanted for higher conductivity, while for the MOSFET recessed oxide is grown around the device well to provide isolation.

The following steps for isolation and interconnection for the structure of FIG. 3 take place after the device fabrication steps described for FIG. 2:

(1) Etching out the metal layer 32 between the devices. A conventional coarse lithographic step is required.
(2) Provide an oxide film 36 over the entire wafer, for example by chemical vapor deposition (CVD).
(3) Open contact holes 38 over the source, drain and gate electrodes through this oxide layer, a step that requires a coarse lithographic mask.
(4) Deposit a conducting metal layer (not shown).
(5) Establish interconnecting line patterns using standard delineation methods. Step 4 and 5 can be repeated if more than one level of interconnection is necessary.

What has been described is a method for fabricating high resolution non planar devices wherein isolation between conductive metal or conductive polysilicon areas is achieved by different height levels of the device structure. The invention was described using examples of MESFET and MOSFET fabrication. However, one skilled in the art will appreciate that the concepts of the present invention may be used in other embodiments.

For example, the invention may also be employed in the fabrication of diodes and bipolar devices and in a structure requiring a plurality of metal bus lines on a wafer; the metal bus lines may be formed at different height levels to provide electrical isolation. Also, although the invention was illustrated using only two height levels, three or more levels may be employed depending on the requirements of the application of the invention.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A method of fabricating structures containing high resolution conductive lines on a supporting substrate comprising the steps of:

applying a layer of resist material over a horizontal substrate at a first height level, exposing patterns of selected regions of said resist material through a high resolution lithography mask, etching said patterned layer of resist material and said substrate down to at least one other different height level wherein selected regions of said patterned resist material and said substrate material subtending said selected regions of said resist material are not etched due to said patterned exposure and remain at a said first height level wherein said first and at least one other different height levels are separated by vertical walls formed by said etching step, and the step of applying a layer of conductive material to said horizontal surfaces of said structure at said first and at least one other different height levels to produce conductive patterns, which are electrically isolated from each other by said vertical walls formed by said etching step and wherein said electrically isolated conductive patterns are electrically isolated by substantially zero distance separation in the horizontal direction to provide said high resolution.

2. A method for fabricating structures according to claim 1 wherein said structures are self-aligned high resolution semiconductor transistor devices and said method further includes the step of doping said surface of said substrate prior to applying said layer of resist material and exposing said layer of resist material through a high resolution lithography mask to define transistor device gate, source and drain elements.

3. A method for fabricating self-aligned high resolution semiconductor transistor devices according to claim 2 wherein said transistor device is a metal-semiconductor field-effect transistor and said method further includes the step of forming a device well area in the surface of said substrate by ion implantation of impurities through a low resolution mask prior to said doping step of claim 2, and wherein said step of applying a layer of electrically conductive material to said horizontal surfaces includes depositing conductive material through a low resolution mask to form contacts to said source and drain elements and to form the electrode of said gate element.

4. A method for fabricating self-aligned high resolution semiconductor transistor devices according to claim 2 wherein said transistor device is a metal-oxide-semiconductor field-effect transistor and said method further includes the step of applying a layer of silicon nitride over said surface of said substrate after said doping step to prevent oxidation of said source and drain elements, and wherein said layer of silicon nitride is etched along with said patterned layer of resist material and said substrate to form a pattern of silicon nitride over said doped substrate, the step of growing a gate oxide on the areas of said substrate exposed by said etching step, said gate oxide being grown only on said etched areas not covered by said pattern of silicon nitride, and the step of removing said silicon nitride prior to depositing said electrically conductive material for forming said electrically isolated conductive patterns.

5. A method for fabricating self-aligned high resolution semiconductor transistor devices according to claim 2 wherein a plurality of transistor devices each including a source drain and gate element are defined on said substrate using said high resolution lithography mask including the further steps of etching out said conductive material between each of said plurality of transistor devices, forming an oxide layer over said entire structure defining and etching contact holes over the source, drain and gate elements of each of said transistor devices using a coarse lithography mask depositing a layer of electrically conductive material over said structure and defining conductive material over said structure and defining conductive line patterns in said conductive layer.

* * * * *